US008304166B2

(12) United States Patent
Loccufier et al.

(10) Patent No.: US 8,304,166 B2
(45) Date of Patent: Nov. 6, 2012

(54) HEAT SENSITIVE POSITIVE-WORKING LITHOGRAPHIC PRINTING PLATE PRECURSOR

(75) Inventors: Johan Loccufier, Zwijnaarde (BE); Stefaan Lingier, Assenede (BE); Heidi Janssens, Aarschot (BE)

(73) Assignee: Agfa Graphics NV, Mortsel (BE)

( * ) Notice: Subject to any disclaimer, the term of this patent is extended or adjusted under 35 U.S.C. 154(b) by 369 days.

(21) Appl. No.: 12/552,690

(22) Filed: Sep. 2, 2009

(65) Prior Publication Data

US 2010/0055610 A1 Mar. 4, 2010

Related U.S. Application Data

(60) Provisional application No. 61/094,064, filed on Sep. 4, 2008.

(30) Foreign Application Priority Data

Sep. 2, 2008 (EP) .................................... 08105202

(51) Int. Cl.
*B41C 1/10* (2006.01)
*G03F 7/11* (2006.01)

(52) U.S. Cl. .................. 430/273.1; 430/271.1; 430/302; 101/467; 101/463.1; 101/457

(58) Field of Classification Search ........................ None
See application file for complete search history.

(56) References Cited

U.S. PATENT DOCUMENTS

| | | | |
|---|---|---|---|
| 3,929,488 | A | 12/1975 | Smith |
| 6,143,464 | A | 11/2000 | Kawauchi |
| 2006/0216639 | A1 | 9/2006 | Tashiro |

FOREIGN PATENT DOCUMENTS

| | | | |
|---|---|---|---|
| EP | 0 864 420 | A1 | 9/1998 |
| EP | 0 909 657 | A2 | 4/1999 |
| EP | 0 933 682 | A2 | 8/1999 |
| EP | 0 934 822 | A1 | 8/1999 |
| EP | 1 072 432 | A2 | 1/2001 |
| EP | 1 120 246 | A2 | 8/2001 |
| EP | 1 211 065 | A2 | 6/2002 |
| EP | 1 241 003 | A2 | 9/2002 |
| EP | 1 275 498 | A2 | 1/2003 |
| EP | 1 291 172 | A2 | 3/2003 |
| EP | 1 433 594 | A2 | 6/2004 |
| EP | 1 268 660 | B1 | 7/2004 |
| EP | 1 439 058 | A2 | 7/2004 |
| EP | 1 311 394 | B1 | 12/2004 |
| EP | 1 262 318 | B1 | 3/2005 |
| EP | 1 263 590 | B1 | 3/2005 |
| EP | 1 011 970 | B1 | 2/2006 |
| EP | 1 299 238 | B1 | 2/2007 |
| EP | 1 826 001 | A1 | 8/2007 |
| EP | 1 826 021 | A1 | 8/2007 |
| EP | 1 368 413 | B1 | 7/2008 |
| WO | WO 99/01795 | A2 | 1/1999 |
| WO | WO 99/63407 | A1 | 12/1999 |
| WO | WO 01/09682 | A2 | 2/2001 |
| WO | WO 02/053626 | A1 | 7/2002 |
| WO | WO 03/074287 | A1 | 9/2003 |
| WO | WO 2004/020484 | A1 | 3/2004 |
| WO | WO 2004/033206 | A1 | 4/2004 |
| WO | WO 2008/073307 | A2 | 6/2008 |
| WO | WO 2008/073310 | A1 | 6/2008 |
| WO | WO 2008/083448 | A1 | 7/2008 |
| WO | WO 2008/089038 | A1 | 7/2008 |

*Primary Examiner* — Cynthia Hamilton
(74) *Attorney, Agent, or Firm* — Leydig, Voit & Mayer, Ltd.

(57) ABSTRACT

A heat-sensitive positive-working lithographic printing plate precursor comprising
(1) a support having a hydrophilic surface or which is provided with a hydrophilic layer,
(2) a heat-sensitive coating, comprising
an underlayer on said support and thereon an upperlayer,
an IR absorbing agent in at least one of said underlayer and upperlayer,
a phenolic resin in said upperlayer, and
a first polymer in said underlayer,
characterized in that said first polymer is an alkaline soluble polymer comprising a first sulfonamide containing monomeric unit having a specified structure according to formula I or formula II and a second amide containing monomeric unit having a specified structure according to formula III.
The printing plates show an improved chemical resistance of the coating and a reduced undercutting of the image forming parts of the coating.

9 Claims, No Drawings

HEAT SENSITIVE POSITIVE-WORKING LITHOGRAPHIC PRINTING PLATE PRECURSOR

FIELD OF THE INVENTION

The present invention relates to a heat-sensitive positive-working lithographic printing plate precursor.

BACKGROUND OF THE INVENTION

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-adhesive (ink-repelling) areas and during driographic printing, only ink is supplied to the master.

Printing masters are generally obtained by the image-wise exposure and processing of an imaging material called plate precursor. A typical positive-working plate precursor comprises a hydrophilic support and an oleophilic coating which is not readily soluble in an aqueous alkaline developer in the non-exposed state and becomes soluble in the developer after exposure to radiation. In addition to the well known photosensitive imaging materials which are suitable for UV contact exposure through a film mask (the so-called pre-sensitized plates), also heat-sensitive printing plate precursors have become very popular. Such thermal materials offer the advantage of daylight stability and are especially used in the so-called computer-to-plate method (CtP) wherein the plate precursor is directly exposed, i.e. without the use of a film mask. The material is exposed to heat or to infrared light and the generated heat triggers a (physico-)chemical process, such as ablation, polymerization, insolubilization by cross-linking of a polymer or by particle coagulation of a thermoplastic polymer latex, and solubilization by the destruction of intermolecular interactions or by increasing the penetrability of a development barrier layer.

Although some of these thermal processes enable platemaking without wet processing, the most popular thermal plates form an image by a heat-induced solubility difference in an alkaline developer between exposed and non-exposed areas of the coating. The coating typically comprises an oleophilic binder of which the rate of dissolution in the developer is either reduced (negative working) or increased (positive working) by the image-wise exposure.

Typically, the oleophilic resin in a heat-sensitive plate is a phenolic resin such as novolac, resol or a polyvinylphenolic resin. The phenolic resin can be chemically modified whereby the phenolic monomeric unit is substituted by a group such as described in WO 99/01795, EP 934 822, EP 1 072 432, U.S. Pat. No. 3,929,488, EP 2 102 443, EP 2 102 444, EP 2 102 445, EP 2 102 446. The phenolic resin can also be mixed with other polymers as described in WO 2004/020484, U.S. Pat. No. 6,143,464, WO 2001/09682, EP 933 682, WO99/63407, WO2002/53626, EP 1 433 594 and EP 1 439 058. The coating can also be composed of two or more layers, each of them comprising one or more of the above described resins as described in e.g. EP 864 420, EP 909 657, EP-A 1 011 970, EP-A 1 263 590, EP-A 1 268 660, EP-A 1 072 432, EP-A 1 120 246, EP-A 1 303 399, EP-A 1 311 394, EP-A 1 211 065, EP-A 1 368 413, EP-A 1 241 003, EP-A 1 299 238, EP-A 1 262 318, EP-A 1 275 498, EP-A 1 291 172, WO 2003/74287, WO 2004/33206, EP-A 1 433 594 and EP-A 1 439 058.

The binder described in EP 864 420 and EP 909 657 is a copolymer which contains not less than 10 mol % of a monomer having a sulphonamide group wherein at least one hydrogen atom is linked to a nitrogen atom. The binder in EP 1 826 001 is a copolymer which contains a specified monomer comprising a sulfonamide group and an optionally N-substituted (meth)acrylamide comonomer such as N-benzyl acrylamide.

SUMMARY OF THE INVENTION

The printing plate precursor of the present invention comprises a heat-sensitive coating having an underlayer and an upperlayer and is positive-working, i.e. after exposure and development the exposed areas of the coating (oleophilic) are removed from the support and define hydrophilic, non-image (non-printing) areas, whereas the unexposed coating is not removed from the support and defines an oleophilic image (printing) area.

An important prerequisite for a high quality printing plate precursor is a high sensitivity, a high chemical resistance and a reduced level of undercutting. A high chemical resistance means that the coating is not or substantially not affected by printing liquids such as ink, e.g. UV-ink, fountain solution, plate and blanket cleaners. The sensitivity is determined by the minimum energy for exposing the coating necessary to obtain a sufficient differentiation between the exposed and non-exposed area such that the underlayer and upperlayer at the exposed areas are completely removed by the developer without substantially affecting the two layers in the non-exposed area. In the non-exposed areas, it is very important that the level of undercutting is reduced or inhibited. Undercutting means that at the edges of non-exposed areas the underlying layer is partially removed while the upperlayer is still present, resulting in smaller printing dot areas when the overhanging part of the upperlayer at the edge disappears. The inventors found a new polymeric binder for the underlying layer of the heat-sensitive coating which is able to exhibit a high sensitivity and which has also the advantage of a high chemical resistance of the coating and a reduced level of undercutting.

It is an aspect of the present invention to provide a heat-sensitive lithographic printing plate precursor as defined in claim 1, having the characteristic feature that the polymer in the underlayer of the heat-sensitive coating of the precursor comprises a first monomeric unit having a structure according to formula I or formula II and a second monomeric unit having a structure according to formula III.

Specific embodiments of the invention are defined in the dependent claims.

DETAILED DESCRIPTION OF THE INVENTION

In accordance with the present invention, there is provided a heat-sensitive positive-working lithographic printing plate precursor comprising (1) a support having a hydrophilic surface or which is provided with a hydrophilic layer, (2) a heat-sensitive coating, comprising
  - an underlayer on said support and thereon an upperlayer,
  - an IR absorbing agent in at least one of said underlayer and upperlayer,
  - a phenolic resin in said upperlayer, and
  - a first polymer in said underlayer, characterized in that said first polymer is an alkaline soluble polymer comprising a first monomeric unit having a structure according to formula I or formula II and a second monomeric unit having a structure according to formula III, (formula I)

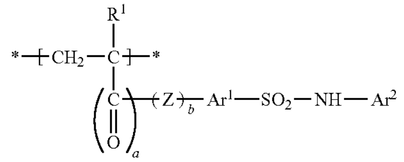

(formula II)

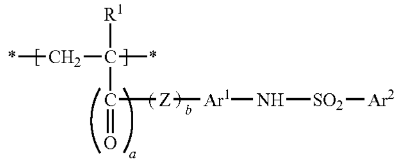

(formula III)

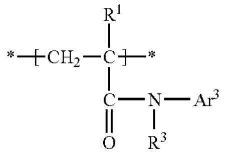

wherein

* denotes the binding sites of the monomeric unit in the polymer backbone, each $R^1$ independently represents hydrogen or an alkyl group, Z represents oxygen or —$NR^2$—, a and b independently are 0 or 1, $R^2$ represents hydrogen or an optionally substituted alkyl, alkenyl or alkynyl group, $Ar^1$ and $Ar^2$ are an aromatic group with the proviso that at least one of $Ar^1$ and $Ar^2$ is an optionally substituted heteroaromatic group, $R^3$ represents hydrogen or an optionally substituted alkyl, alkenyl, alkynyl, aralkyl or alkaryl group, or an aryl or heteroaryl group which is not substituted by a sulphonamide group, and $Ar^3$ is an aromatic group which is not substituted by a sulphonamide group.

In the first and second monomeric unit of the present invention, each $R^1$ group is independently represented by hydrogen or an alkyl group. Said alkyl group is preferably a lower alkyl group such as a methyl, ethyl, propyl or butyl group. Each $R^1$ is most preferably represented by hydrogen or a methyl group.

In the first monomeric unit of the present invention, Z represents oxygen or —$NR^2$—, preferably —$NR^2$— wherein $R^2$ is hydrogen or an optionally substituted alkyl, alkenyl or alkynyl group. $R^2$ is preferably hydrogen or an alkyl group, more preferably hydrogen.

In the first monomeric unit of the present invention, a and b are independently 0 or 1; preferably, a is 0 and b is 1; more preferably, a is 0 and b is 0; most preferably a is 1 and b is 1.

In the first monomeric unit of the present invention, when a is 0 and b is 1, Z is preferably oxygen.

In the first monomeric unit of the present invention, when a is 1 and b is 1, Z is preferably —$NR^2$— wherein $R^2$ is hydrogen or an optionally substituted alkyl, alkenyl or alkynyl group, preferably hydrogen.

In the first monomeric unit of the present invention, $Ar^1$ and $Ar^2$ are aromatic groups with the proviso that at least one of $Ar^1$ and $Ar^2$ is an optionally substituted heteroaromatic group. $Ar^1$ is a bivalent aromatic group and $Ar^2$ is a monovalent aromatic group. These aromatic groups may be derived from aromatic compounds wherein two hydrogen atoms of $Ar^1$ are replaced by two binding sites and wherein one hydrogen atom of $Ar^2$ is replaced by one binding site. Said aromatic compounds may be selected from the group consisting of hydrocarbon aromatic compounds such as benzene, naphthalene or antracene, and heteroaromatic compounds such as furan, thiophene, pyrrole, pyrazole, imidazole, 1,2,3-triazole, 1,2,4-triazole, tetrazole, oxazole, isoxazole, thiazole, isothiazole, thiadiazole, oxadiazole, pyridine, pyridazine, pyrimidine, pyrazine, 1,3,5-triazine, 1,2,4-triazine or 1,2,3-triazine. All these compounds may be annulated such as benzofuran, benzothiophene, indole, indazole, benzoxazole, quinoline, quinazoline, benzimidazole or benztriazole, and/or substituted by at least a group selected from the group consisting of an alkyl, cycloalkyl alkenyl or cyclo alkenyl group, an aryl or heteroaryl group, an alkylaryl or arylalkyl group, an alkoxy or aryloxy group, a thio alkyl, thio aryl or thio heteroaryl group, a hydroxyl group, —SH, a carboxylic acid group or an alkyl ester thereof, a sulphonic acid group or an alkyl ester thereof, a phosphonic acid group or an alkyl ester thereof, a phosphoric acid group or an alkyl ester thereof, an amino group, a sulphonamide group, an amide group, a nitro group, a nitrile group a halogen or a combination of at least two of these groups, including at least one of these groups which is further substituted by one of these groups. $Ar^2$ is more preferably an optionally substituted heteroaromatic group, most preferably an optionally substituted heteroaromatic group having at least one nitrogen atom in the aromatic ring such as pyridine, pyradazine, pyrimidine, pyrazine, 1,3,5-triazine, 1,2,4-triazine, 1,2,3-triazine, pyrrole, pyrazole, imidazole, 1,2,3-triazole, 1,2,4-triazole, tetrazole, oxazole, isoxazole, thiazole, isothiazole, thiadiazole or oxadiazole.

In another preferred embodiment of the present invention, said first monomeric unit has a structure according to formula I.

Examples of first monomeric units having the structure of formula I or formula II of the present invention, are given below as monomers.

Examples of monomers according to formula I:

Mono-I-01:

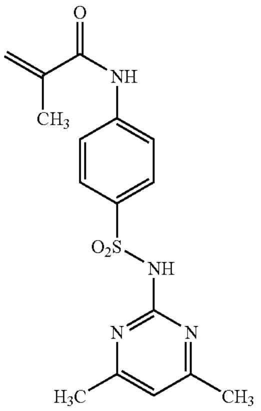

-continued
Mono-I-02:
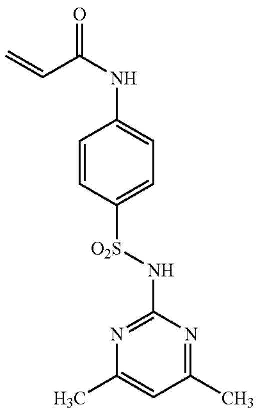
Mono-I-03:
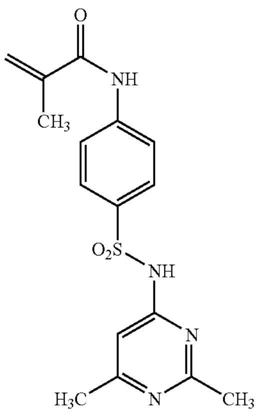
Mono-I-04:
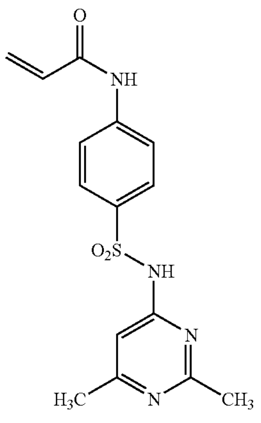
-continued
Mono-I-05:
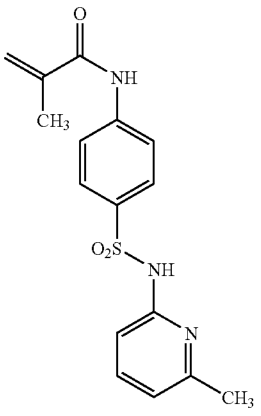
Mono-I-06:
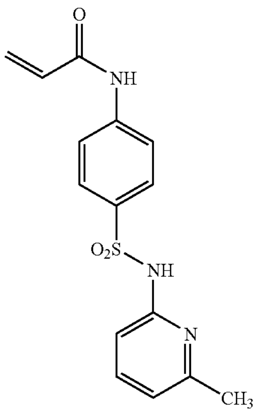
Mono-I-07:
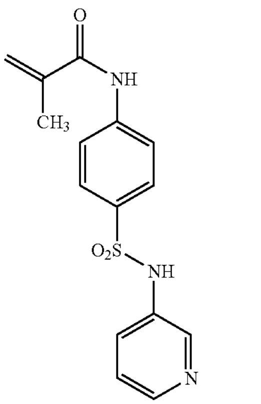

-continued
Mono-I-08:
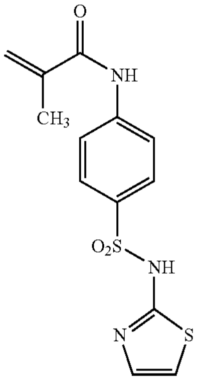
Mono-I-09:
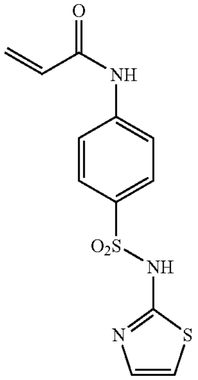
Mono-I-10:
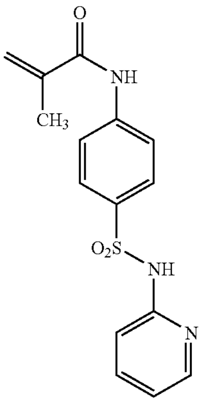
-continued
Mono-I-11:
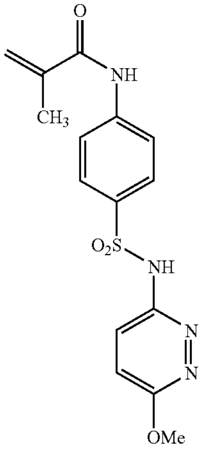
Mono-I-12:
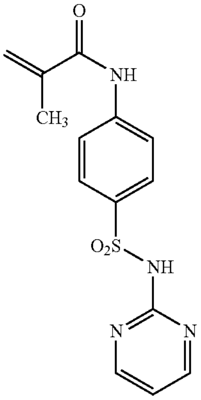
Mono-I-13:
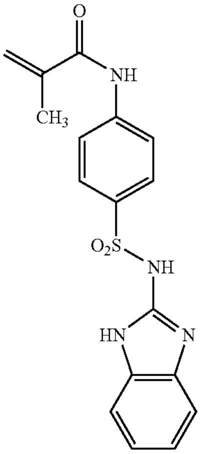

-continued
Mono-I-14:
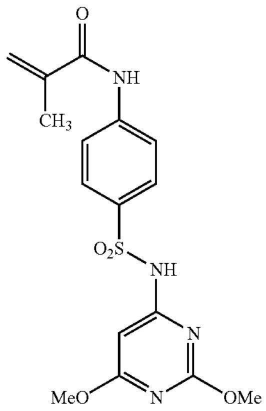
Mono-I-15:
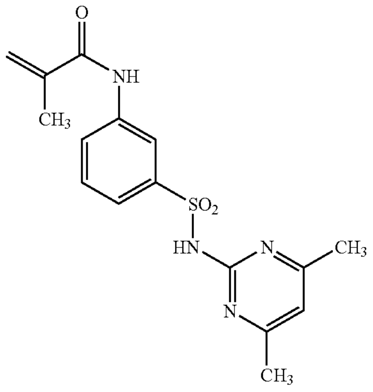
Mono-I-16:
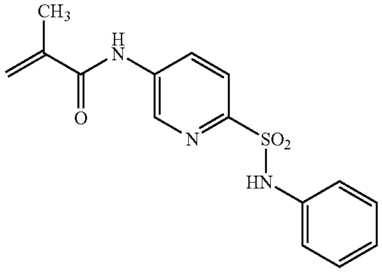
Mono-I-17:
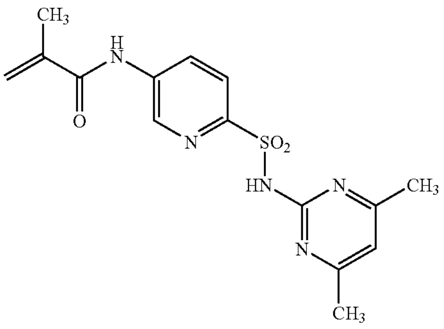
-continued
Mono-I-18:
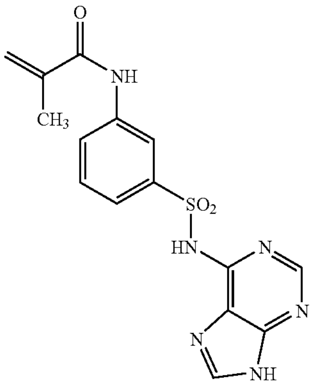
Mono-I-19:
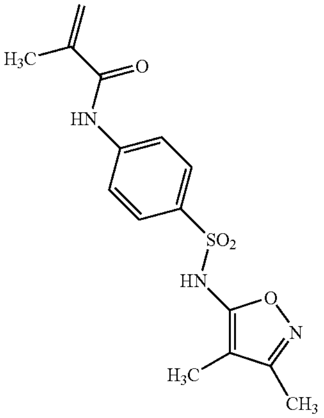
Mono-I-20:
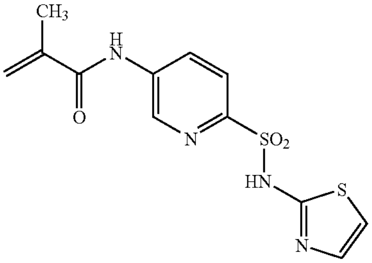
Mono-I-21:
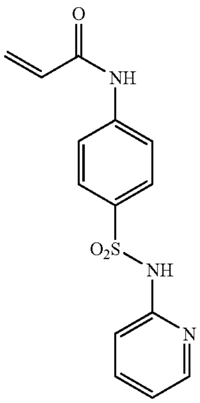

-continued

Mono-I-22:

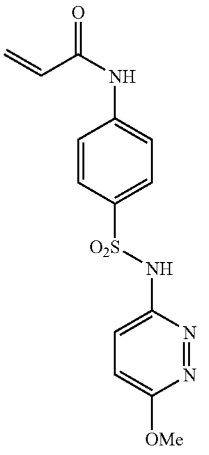

Mono-I-23:

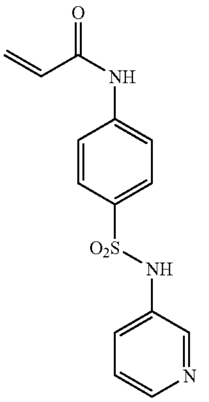

Examples of monomers according to formula II:

Mono-II-01:

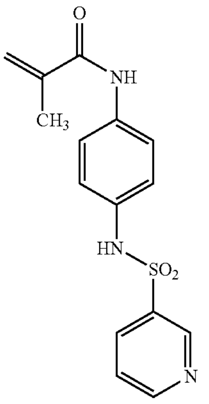

-continued

Mono-II-02:

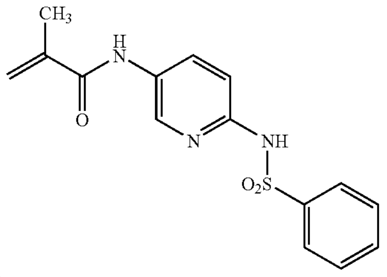

Mono-II-03:

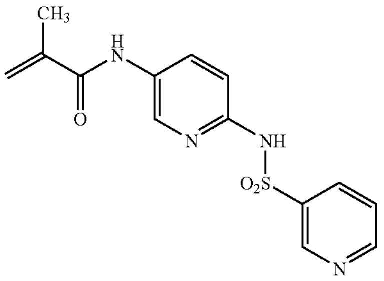

Mono-II-04:

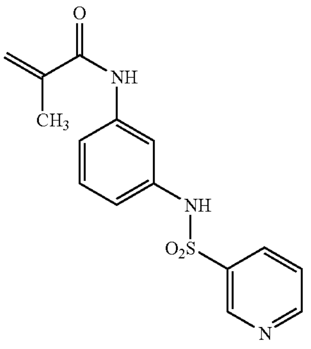

According to the present invention, the first polymer further comprises a second monomeric unit having the structure of formula III.

In the second monomeric unit of the present invention, $R^3$ is hydrogen or an optionally substituted alkyl, alkenyl, alkynyl, aralkyl or alkaryl group, or an aryl or heteroaryl group which is not substituted by a sulphonamide group. In a preferred embodiment, $R^3$ is one of these groups with the exception of an optionally substituted alkaryl group such as an optionally substituted benzyl group. In a more preferred embodiment, $R^3$ is hydrogen or an optionally substituted alkyl group; most preferably, $R^3$ is hydrogen.

In the second monomeric unit of the present invention, $Ar^3$ is an aromatic group, which is not substituted by a sulphonamide group. $Ar^3$ is preferably an optionally substituted aryl or heteroaromatic group, which is not substituted by a sulphonamide group. $Ar^3$ is a monovalent aromatic group and this aromatic group may be derived from aromatic compounds wherein one hydrogen atom is replaced by one binding site for $Ar^3$. Said aromatic compounds may be selected from the group consisting of hydrocarbon aromatic compounds such as benzene, naphthalene or antracene, and heteroaromatic compounds such as furan, thiophene, pyrrole, pyrazole, imidazole, 1,2,3-triazole, 1,2,4-triazole, tetrazole, oxazole, isoxazole, thiazole, isothiazole, thiadiazole, oxadiazole, pyridine, pyridazine, pyrimidine, pyrazine, 1,3,5-triazine, 1,2,4-triazine or 1,2,3-triazine.

In a more preferred embodiment, $Ar^3$ is an optionally substituted phenyl or pyridyl group, which is not substituted by a sulphonamide group; most preferably, $Ar^3$ is an optionally substituted phenyl group, which is not substituted by a sulphonamide group.

All these aromatic compounds may be annulated by another cyclic structure and may be represented by a benzofuran, benzothiophene, indole, indazole, benzoxazole, quinoline, quinazoline, benzimidazole or benztriazole group.

Each of these optionally substituting groups in $Ar^3$ may be selected from the group consisting of an alkyl, cycloalkyl alkenyl or cycloalkenyl group; an aryl or heteroaryl group; an alkylaryl or arylalkyl group; an alkoxy or aryloxy group; a thio alkyl, thio aryl or thio heteroaryl group; an alkyl ester of a hydroxyl, —SH, a carboxylic acid group; an alkyl ester of a sulphonic acid group; an alkyl ester of a phosphonic acid group; an alkyl ester of a phosphoric acid group; an amino group; a nitro group; a nitrile group; a halogen; or a combination of at least two of these groups, including at least one of these groups which is further substituted by one of these groups.

The optionally substituting group of said aryl, hetereoaryl, pyrydyl or phenyl group is more preferably at least one of the groups of —$R^i$, —COO—$R^{ii}$, —$SO_2$—$R^{iii}$, —CO—$R^{iv}$, —O—$R^v$, a halogen, nitrile or nitro group, or a combination of two or more of these groups, wherein each $R^i$ to $R^v$ groups independently represents an alkyl group, preferably methyl, ethyl, propyl or butyl group.

In another preferred embodiment, this optionally substituting group of said aryl, hetereoaryl, pyridyl or phenyl group does not comprise an acidic group such as a phenolic hydroxyl group, a carboxylic acid group or a sulphonic acid group.

Examples of monomers according to formula III:

Mono-III-01:

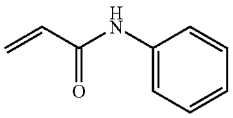

Mono-III-02:

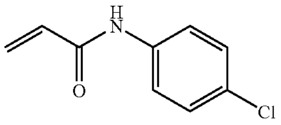

Mono-III-03:

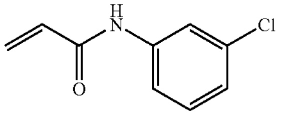

Mono-III-04:

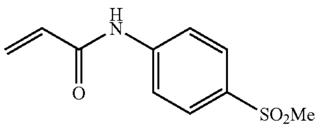

Mono-III-05:

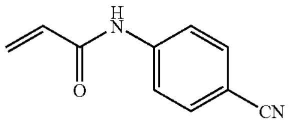

-continued

Mono-III-06:

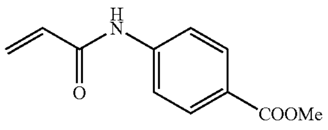

Mono-III-07:

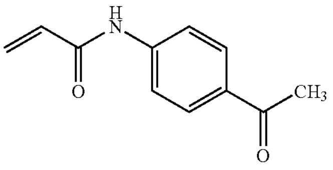

Mono-III-08:

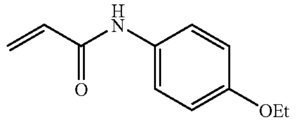

Mono-III-09:

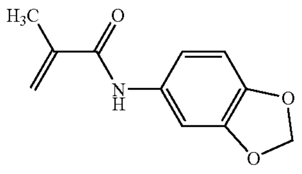

Mono-III-10:

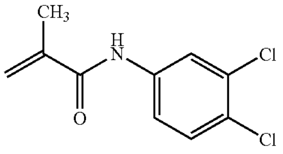

Mono-III-11:

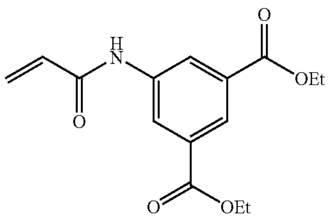

Mono-III-12:

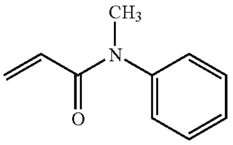

Mono-III-13:

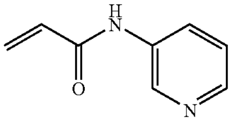

Mono-III-14:

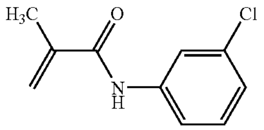

-continued

Mono-III-15:

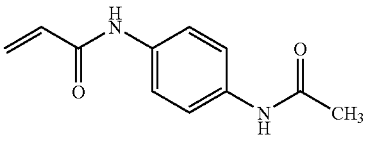

Mono-III-16:

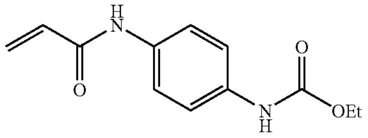

Mono-III-17:

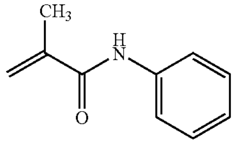

Mono-III-18:

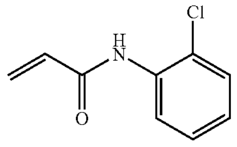

Mono-III-19:

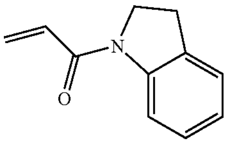

Mono-III-20:

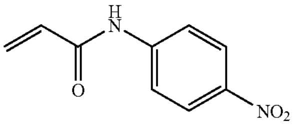

The first polymer of the present invention may further comprise other monomeric units selected from hydrophobic monomers, i.e. monomers which comprises in the side chain of the monomeric unit a hydrophobic group such as an alkyl or aryl group, and/or from hydrophilic monomers, i.e. monomers which comprises in the side chain of the monomeric unit a hydrophilic group such as acid group or an amide, hydroxyl or ethyleneoxide group. The type of the other co-monomers and the amount of them in the first polymer are selected such that the first polymer is soluble in an alkaline solution. These other co-monomers may be selected from the group consisting of (meth)acrylic acid, (meth)acrylonitrile, (meth)acryl amide, an optionally N-substituted (meth)acryl amide, an optionally N-substituted maleimide, an ester of a (meth) acrylic acid, polyoxyethylene chain in the ester group of a (meth)acrylic acid ester, 2-hydroxy ethyl (meth)acrylate, an optionally substituted styrene, a styrene sulphonic acid, an o-, p- or m-vinyl benzoic acid, an optionally substituted vinyl pyridine, N-vinyl caprolactam, N-vinyl pyrrolidone, itaconic acid, maleic acid, glycidyl (meth)acrylate, optionally hydrolysed vinyl acetate and vinyl phosphonic acid. Preferably, the other co-monomer is (meth)acrylic acid, an alkyl (meth)acrylate, (meth)acrylonitrile or vinylcaprolactam.

Typical examples of first polymers according to the present invention, represented by their monomer composition, are given below, without being limited thereto.

Polymer Composition-01 comprises Mono-I-01 and Mono-III-01;

Polymer Composition-02 comprises Mono-I-01 and Mono-III-04;

Polymer Composition-03 comprises Mono-I-01 and Mono-III-02;

Polymer Composition-04 comprises Mono-I-01 and Mono-III-08;

Polymer Composition-05 comprises Mono-I-01 and Mono-III-05;

Polymer Composition-06 comprises Mono-I-01 and Mono-III-06;

Polymer Composition-07 comprises Mono-I-01 and Mono-III-07;

Polymer Composition-08 comprises Mono-I-01 and Mono-III-11;

Polymer Composition-09 comprises Mono-I-05 and Mono-III-01;

Polymer Composition-10 comprises Mono-I-03, Mono-III-01 and Mono-III-05;

Polymer Composition-11 comprises Mono-I-08; Mono-III-01 and vinyl caprolactam;

Polymer Composition-12 comprises Mono-I-07 and Mono-III-01;

Polymer Composition-13 comprises Mono-I-02 and Mono-III-17;

Polymer Composition-14 comprises Mono-I-01, Mono-III-01 and acrylonitrile;

Polymer Composition-15 comprises Mono-I-02, Mono-III-01 and ethylacrylate;

Polymer Composition-16 comprises Mono-I-01 and Mono-III-13;

Polymer Composition-17 comprises Mono-I-02 and Mono-III-01;

Polymer Composition-18 comprises Mono-II-01 and Mono-III-01;

Polymer Composition-19 comprises Mono-I-11 and Mono-III-05;

Polymer Composition-20 comprises Mono-I-13 and Mono-III-05; and

Polymer Composition-21 comprises Mono-I-15 and Mono-III-05.

The first polymer of the present invention comprises a first monomeric unit having a structure according to formula I or formula II and a second monomeric unit having a structure according to formula III and this first polymer is soluble in an alkaline solution. In a preferred embodiment, the first polymer comprises said first monomeric unit in an amount of at least 10 mol % and said second monomeric unit in an amount of at least 5 mol %. In another preferred embodiment, the first polymer comprises said first monomeric unit in an amount ranging between 20 and 90 mol %, more preferably between 30 and 80 mol %, most preferably between 40 and 75 mol %, and said second monomeric unit in an amount ranging between 10 and 80 mol %, more preferably between 20 and 70 mol %, most preferably between 25 and 60 mol %.

The first polymer of the present invention has preferably a molecular weight ranging for $M_n$, i.e. number average molecular weight, between 10 000 and 500 000, more preferably between 10 000 and 200 000, most preferably between 10 000 and 100 000, and for $M_w$, i.e. weight average molecular weight, between 10 000 and 1 000 000, more preferably between 20 000 and 500 000, most preferably between 20 000 and 200 000. These molecular weights are determined by the method as described in the Examples.

Examples of first polymers, represented by the composing monomers in a molar ratio as indicated below, of the present invention are:

Polymer-01: copolymer of 65 mol % Mono-I-01 and 35 mol % Mono-III-01;

Polymer-02: copolymer of 65 mol % Mono-I-01 and 35 mol % Mono-III-04;

Polymer-03: copolymer of 65 mol % Mono-I-01 and 35 mol % Mono-III-02;

Polymer-04: copolymer of 65 mol % Mono-I-01 and 35 mol % Mono-III-08;

Polymer-05: copolymer of 65 mol % Mono-I-01 and 35 mol % Mono-III-05;

Polymer-06: copolymer of 65 mol % Mono-I-01 and 35 mol % Mono-III-06;

Polymer-07: copolymer of 65 mol % Mono-I-01 and 35 mol % Mono-III-07.

The heat-sensitive lithographic printing plate precursor of the present invention comprises a support having a hydrophilic surface or which is provided with a hydrophilic layer, and, on said support, a heat-sensitive coating.

Support

The support of the lithographic printing plate precursor has a hydrophilic surface or is provided with a hydrophilic layer. The support may be a sheet-like material such as a plate or it may be a cylindrical element such as a sleeve which can be slid around a print cylinder of a printing press. A preferred support is a metal support such as aluminum or stainless steel. The metal can also be laminated to a plastic layer, e.g. polyester film.

A particularly preferred lithographic support is an electrochemically grained and anodized aluminum support. Graining and anodization of aluminum is well known in the art. The anodized aluminum support may be treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde. It is further evident that one or more of these post-treatments may be carried out alone or in combination. More detailed descriptions of these treatments are given in GB-A 1 084 070, DE-A 4 423 140, DE-A 4 417 907, EP-A 659 909, EP-A 537 633, DE-A 4 001 466, EP-A 292 801, EP-A 291 760 and U.S. Pat. No. 4,458,005.

Coating

The heat-sensitive coating, which is provided on the support, is positive-working. The coating of a positive-working heat-sensitive coating does not dissolve in an alkaline developing solution in the unexposed areas and becomes soluble in the exposed areas within the time used for developing the plate. The coating comprises an underlayer which comprises a first polymer as defined above, and an upperlayer which comprises a phenolic resin, and an infrared absorbing agent which is present in at least one of the underlayer and upperlayer.

Said phenolic resin is an alkaline soluble oleophilic resin whereof the solubility in an alkaline developing solution is reduced in the coating and whereof the solubility in an alkaline developing solution is increased upon heating or IR-radiation. The coating preferably further comprises a dissolution inhibitor whereby rate of dissolution in an alkaline developing solution is reduced. The inhibitor is preferably present in the upperlayer of the coating. Due to this solubility differential the rate of dissolution of the exposed areas is sufficiently higher than in the non-exposed areas.

The phenolic resin is preferably a novolac, a resol or a polyvinylphenolic resin; novolac is more preferred. Typical examples of such polymers are described in DE-A-4007428, DE-A-4027301 and DE-A-4445820. Other preferred polymers are phenolic resins wherein the phenyl group or the hydroxy group of the phenolic monomeric unit are chemically modified with an organic substituent as described in EP 894 622, EP 901 902, EP 933 682, WO99/63407, EP 934 822, EP 1 072 432, U.S. Pat. No. 5,641,608, EP 982 123, WO99/01795, WO04/035310, WO04/035686, WO04/035645, WO04/035687 or EP 1 506 858.

The novolac resin or resol resin may be prepared by polycondensation of at least one member selected from aromatic hydrocarbons such as phenol, o-cresol, p-cresol, m-cresol, 2,5-xylenol, 3,5-xylenol, resorcinol, pyrogallol, bisphenol, bisphenol A, trisphenol, o-ethylphenol, p-ethylphenol, propylphenol, n-butylphenol, t-butylphenol, 1-naphthol and 2-naphthol, with at least one aldehyde or ketone selected from aldehydes such as formaldehyde, glyoxal, acetoaldehyde, propionaldehyde, benzaldehyde and furfural and ketones such as acetone, methyl ethyl ketone and methyl isobutyl ketone, in the presence of an acid catalyst. Instead of formaldehyde and acetaldehyde, paraformaldehyde and paraldehyde may, respectively, be used.

The weight average molecular weight, measured by gel permeation chromatography using universal calibration and polystyrene standards, of the novolac resin is preferably from 500 to 150,000 g/mol, more preferably from 1,500 to 50,000 g/mol.

The poly(vinylphenol) resin may also be a polymer of one or more hydroxy-phenyl containing monomers such as hydroxystyrenes or hydroxy-phenyl (meth)acrylates. Examples of such hydroxystyrenes are o-hydroxystyrene, m-hydroxystyrene, p-hydroxystyrene, 2-(o-hydroxyphenyl)propylene, 2-(m-hydroxyphenyl)propylene and 2-(p-hydroxyphenyl)propylene. Such a hydroxystyrene may have a substituent such as chlorine, bromine, iodine, fluorine or a $C_{1-4}$ alkyl group, on its aromatic ring. An example of such hydroxy-phenyl (meth)acrylate is 2-hydroxy-phenyl methacrylate.

The poly(vinylphenol) resin may usually be prepared by polymerizing one or more hydroxy-phenyl containing monomer in the presence of a radical initiator or a cationic polymerization initiator. The poly(vinylphenol) resin may also be prepared by copolymerizing one or more of these hydroxy-phenyl containing monomers with other monomeric compounds such as acrylate monomers, methacrylate monomers, acrylamide monomers, methacrylamide monomers, vinyl monomers, aromatic vinyl monomers or diene monomers.

The weight average molecular weight, measured by gel permeation chromatography using universal calibration and polystyrene standards, of the poly(vinylphenol) resin is preferably from 1.000 to 200,000 g/mol, more preferably from 1,500 to 50,000 g/mol.

Examples of phenolic resins are:

RESIN-01: ALNOVOL SPN452 is a solution of a novolac resin, 40% by weight in Dowanol PM, obtained from CLARIANT GmbH.

Dowanol PM consists of 1-methoxy-2-propanol (>99.5%) and 2-methoxy-1-propanol (<0.5%).

RESIN-02: ALNOVOL SPN400 is a solution of a novolac resin, 44% by weight in Dowanol PMA, obtained from CLARIANT GmbH.

Dowanol PMA consists of 2-methoxy-1-methyl-ethylacetate.

RESIN-03: ALNOVOL HPN100 a novolac resin obtained from CLARIANT GmbH.

RESIN-04: DURITE PD443 is a novolac resin obtained from BORDEN CHEM. INC.

RESIN-05: DURITE SD423A is a novolac resin obtained from BORDEN CHEM. INC.

RESIN-06: DURITE SD126A is a novolac resin obtained from BORDEN CHEM. INC.

RESIN-07: BAKELITE 6866LB02 is a novolac resin obtained from BAKELITE AG.

RESIN-08: BAKELITE 6866LB03 is a novolac resin obtained from BAKELITE AG.

RESIN-09: KR 400/8 is a novolac resin obtained from KOYO CHEMICALS INC.

RESIN-10: HRJ 1085 is a novolac resin obtained from SCHNECTADY INTERNATIONAL INC.

RESIN-11: HRJ 2606 is a phenol novolac resin obtained from SCHNECTADY INTERNATIONAL INC.

RESIN-12: LYNCUR CMM is a copolymer of 4-hydroxystyrene and methyl methacrylate obtained from SIBER HEGNER.

The heat-sensitive coating may further comprise another binder which is insoluble in water and soluble in an alkaline solution such as an organic polymer which has acidic groups with a pKa of less than 13 to ensure that the layer is soluble or at least swellable in aqueous alkaline developers. Advantageously, this binder is a polymer or polycondensate, for example a polyester, a polyamide resin, an epoxy resin, an acetal resin, an acrylic resin, a methacrylic resin, a styrene based resin, a polyurethane resin or polyurea. The polymer may have one or more functional groups selected from the list of (i) a sulfonamide group such as —$SO_2$—NH—$R^g$ wherein $R^g$ represents a hydrogen or an optionally substituted hydrocarbon group such as an optionally substituted alkyl, aryl or heteroaryl group, (ii) an active imide group such as —$SO_2$—NH—CO—$R^h$, —$SO_2$—NH—$SO_2$—$R^h$ or —CO—NH—$SO_2$—$R^h$ wherein $R^h$ represents a hydrogen or an optionally substituted hydrocarbon group such as an optionally substituted alkyl, aryl or heteroaryl group, (iii) a carboxyl group, (iv) a sulfonic group, and (v) a phosphoric group; a sulfonamide group or an active imide group are more preferred. The polymer may be selected from a copolymer comprising a N-benzyl-maleimide monomeric unit or a monomeric unit comprising a sulfonamide group as described in EP-A 933 682, EP 0 894 622 (page 3 line 16 to page 6 line 30), EP-A 0 982 123 (page 3 line 56 to page 51 line 5), EP-A 1 072 432 (page 4 line 21 to page 10 line 29) and WO 99/63407 (page 4 line 13 to page 9 line 37).

Other polymers having an acidic group are polycondensates and polymers having free phenolic hydroxyl groups, as obtained, for example, by reacting phenol, resorcinol, a cresol, a xylenol or a trimethylphenol with aldehydes, especially formaldehyde, or ketones, may be added to the heat-sensitive coating. Condensates of sulfamoyl- or carbamoyl-substituted aromatics and aldehydes or ketones are also suitable. Polymers of bismethylol-substituted ureas, vinyl ethers, vinyl alcohols, vinyl acetals or vinylamides and polymers of phenylacrylates and copolymers of hydroxy-phenylmaleimides are likewise suitable. Furthermore, polymers having units of vinylaromatics or aryl (meth)acrylates may be mentioned, it being possible for each of these units also to have one or more carboxyl groups, phenolic hydroxyl groups, sulfamoyl groups or carbamoyl groups. Specific examples include polymers having units of 2-hydroxyphenyl (meth) acrylate, of 4-hydroxystyrene or of hydroxyphenylmaleimide. The polymers may additionally contain units of other monomers which have no acidic units. Such units include vinylaromatics, methyl (meth)acrylate, phenyl(meth)acrylate, benzyl (meth)acrylate, methacrylamide or acrylonitrile.

Dissolution Inhibitor

In a preferred embodiment of the present invention, the heat-sensitive coating or the heat-sensitive upperlayer also contain one or more dissolution inhibitors. Dissolution inhibitors are compounds which reduce the dissolution rate of the hydrophobic polymer in the aqueous alkaline developer at the non-exposed areas of the coating and wherein this reduction of the dissolution rate is destroyed by the heat generated during the exposure so that the coating readily dissolves in the developer in the exposed areas. The dissolution inhibitor triggers a substantial differentiation in dissolution rate between the exposed and non-exposed areas. The dissolution inhibitor triggers a good dissolution rate differentiation when the exposed coating areas have dissolved completely in the developer before the non-exposed areas are attacked by the developer to such an extent that the ink-accepting capability of the coating is affected. The dissolution inhibitor(s) can be added to the layer which comprises the phenolic resin (e.g. the upperlayer) discussed above.

The dissolution rate of the non-exposed coating in the developer is preferably reduced by interaction between the hydrophobic polymer and the inhibitor, due to e.g. hydrogen bonding between these compounds. Suitable dissolution inhibitors are preferably organic compounds which comprise at least one aromatic group and a hydrogen bonding site, e.g. a carbonyl group, a sulfonyl group, or a nitrogen atom which may be quaternized and which may be part of a heterocyclic ring or which may be part of an amino substituent of said organic compound. Suitable dissolution inhibitors of this type have been disclosed in e.g. EP-A 825 927 and 823 327.

Water-repellent polymers represent another type of suitable dissolution inhibitors. Such polymers seem to increase the developer resistance of the coating by repelling the aqueous developer from the coating. The water-repellent polymers can be added to the upperlayer and/or can be present in a separate layer provided on top of the upperlayer. In the latter embodiment, the water-repellent polymer forms a barrier layer which shields the coating from the developer and the solubility of the barrier layer in the developer or the penetrability of the barrier layer by the developer can be increased by exposure to heat or infrared light, as described in e.g. EP-A 864420, EP-A 950 517 and WO99/21725. Preferred examples of the water-repellent polymers are polymers comprising siloxane and/or perfluoroalkyl units. In one embodiment, the coating contains such a water-repellent polymer in an amount between 0.5 and 25 $mg/m^2$, preferably between 0.5 and 15 $mg/m^2$ and most preferably between 0.5 and 10 $mg/m^2$. When the water-repellent polymer is also ink-repelling, e.g. in the case of polysiloxanes, higher amounts than 25 $mg/m^2$ can result in poor ink-acceptance of the non-exposed areas. An amount lower than 0.5 $mg/m^2$ on the other hand may lead to an unsatisfactory developer resistance. The polysiloxane may be a linear, cyclic or complex cross-linked polymer or copolymer. The term polysiloxane compound shall include any compound which contains more than one siloxane group —Si(R,R')—O—, wherein R and R' are optionally substituted alkyl or aryl groups. Preferred siloxanes are phenylalkylsiloxanes and dialkylsiloxanes. The number of siloxane groups in the (co)polymer is at least 2, preferably at least 10, more preferably at least 20. It may be less than 100, preferably less than 60. In another embodiment, the water-repellent polymer is a block-copolymer or a graft-copolymer of a poly (alkylene oxide) block and a block of a polymer comprising siloxane and/or perfluoroalkyl units. A suitable copolymer comprises about 15 to 25 siloxane units and 50 to 70 alkylene oxide groups. Preferred examples include copolymers comprising phenylmethylsiloxane and/or dimethylsiloxane as well as ethylene oxide and/or propylene oxide, such as Tego Glide 410, Tego Wet 265, Tego Protect 5001 or Silikophen P50/X, all commercially available from Tego Chemie, Essen, Germany. Such a copolymer acts as a surfactant which upon coating, due to its bifunctional structure, automatically positions itself at the interface between the coating and air and thereby forms a separate top layer even when the whole coating of upperlayer and toplayer is applied from a single coating solution. Simultaneously, such surfactants act as a spreading agent which improves the coating quality. Alternatively, the water-repellent polymer can be applied in a separate solution, coated on top of the upperlayer. In that embodiment, it may be advantageous to use a solvent in this separate coating solution that is not capable of dissolving the ingredients present in the upperlayer so that a highly concentrated water-repellent phase is obtained at the top of the coating.

Development Accelerator

Preferably, also one or more development accelerators are included in the heat-sensitive coating or in the heat-sensitive upperlayer, i.e. compounds which act as dissolution promoters because they are capable of increasing the dissolution rate of the non-exposed coating in the developer. The simultaneous application of dissolution inhibitors and accelerators allows a precise fine tuning of the dissolution behavior of the coating. Suitable dissolution accelerators are cyclic acid anhydrides, phenols or organic acids. Examples of the cyclic acid anhydride include phthalic anhydride, tetrahydrophthalic anhydride, hexahydrophthalic anhydride, tetrachlorophthalic anhydride, maleic anhydride, chloromaleic anhydride, alpha-phenylmaleic anhydride, succinic anhydride, and pyromellitic anhydride, as described in U.S. Pat. No. 4,115,128. Examples of the phenols include bisphenol A, p-nitrophenol, p-ethoxyphenol, 2,4,4'-trihydroxybenzophenone, 2,3,4-trihydroxy-benzophenone, 4-hydroxybenzophenone, 4,4',4"-trihydroxy-triphenylmethane, and 4,4',3",4"-tetrahydroxy-3,5,3',5'-tetramethyltriphenyl-methane, and the like. Examples of the organic acids include sulfonic acids, sulfinic acids, alkylsulfuric acids, phosphonic acids, phosphates, and carboxylic acids, as described in, for example, JP-A Nos. 60-88,942 and 2-96,755. Specific examples of these organic acids include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid. The amount of the cyclic acid anhydride, phenol, or organic acid contained in the coating is preferably in the range of 0.05 to 20% by weight, relative to the coating as a whole.

Exposure

The material can be image-wise exposed directly with heat, e.g. by means of a thermal head, or indirectly by infrared light, which is preferably converted into heat by an infrared light absorbing compound, which may be a dye or pigment having an absorption maximum in the infrared wavelength range. The infrared light absorbing dye or pigment is present in at least one of the underlayer and upperlayer of the heat-sensitive coating and typically in a concentration ranging between 0.25 and 10.0 wt. %, more preferably between 0.5 and 7.5 wt. % relative to the coating as a whole. Preferred IR-absorbing compounds are dyes such as cyanine or merocyanine dyes or pigments such as carbon black. A suitable compound is the following infrared dye IR-1:

(IR-1)

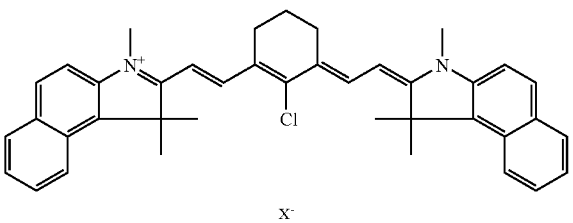

wherein $X^-$ is a suitable counter ion such as tosylate.

The heat-sensitive coating may further contain an organic dye which absorbs visible light so that a perceptible image is obtained upon image-wise exposure and subsequent development. Such a dye is often called contrast dye or indicator dye. Preferably, the dye has a blue color and an absorption maximum in the wavelength range between 600 nm and 750 nm. Although the dye absorbs visible light, it preferably does not sensitize the printing plate precursor, i.e. the coating does not become more soluble in the developer upon exposure to visible light. Suitable examples of such a contrast dye are the quaternized triarylmethane dyes.

According to a preferred embodiment, the contrast dye is present in the underlayer and/or upperlayer of the heat-sensitive coating.

According to a highly preferred embodiment, the infrared light absorbing compound is present in the underlayer and/or upperlayer of the heat-sensitive coating.

The printing plate precursor of the present invention can be exposed to infrared light with LEDs or a laser. Preferably, a laser emitting near infrared light having a wavelength in the range from about 750 to about 1500 nm is used, such as a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at $1/e^2$ of maximum intensity: 10-25 μm), the scan speed and the resolution of the exposure apparatus (i.e. the number of addressable pixels per unit of linear distance, often expressed in dots per inch or dpi; typical value: 1000-4000 dpi).

Two types of laser exposure apparatuses are commonly used: internal (ITD) and external drum (XTD) plate-setters. ITD plate-setters for thermal plates are typically characterized by a very high scan speed up to 500 m/sec and may require a laser power of several Watts. XTD plate-setters for thermal plates having a typical laser power from about 200 mW to about 1 W operate at a lower scan speed, e.g. from 0.1 to 10 m/sec.

The known platesetters can be used as an off-press exposure apparatus, which offers the benefit of reduced press down-time. XTD platesetter configurations can also be used for on-press exposure, offering the benefit of immediate registration in a multi-color press. More technical details of on-press exposure apparatuses are described in e.g. U.S. Pat. Nos. 5,174,205 and 5,163,368.

Developing

In the development step, the non-image areas of the coating are removed by immersion in an aqueous alkaline developer, which may be combined with mechanical rubbing, e.g. by a rotating brush. The developer comprises an alkaline agent which may be an inorganic alkaline agent such as an alkali metal hydroxide, an organic alkaline agent such as an amine, and/or an alkaline silicate such as an alkali metal silicate or an alkali metal metasilicate. The developer preferably has a pH above 10, more preferably above 12. The developer may further contain components such as a buffer substance, a complexing agent, an antifoaming agent, an organic solvent, a corrosion inhibitor, a dye, an antisludge agent, a dissolution preventing agent such as a non-ionic surfactant, an anionic, cationic or amphoteric surfactant and/or a hydrotropic agent as known in the art. The developer may further contain a poly-hydroxyl compound such as e.g. sorbitol, preferably in a concentration of at least 40 g/l, and also a polyethylene oxide containing compound such as e.g. Supronic B25, commercially available from RHODIA, preferably in a concentration of at most 0.15 g/l.

The development step may be followed by a rinsing step and/or a gumming step. The gumming step involves post-treatment of the lithographic printing plate with a gum solution. A gum solution is typically an aqueous liquid which comprises one or more surface protective compounds that are capable of protecting the lithographic image of a printing plate against contamination or damaging. Suitable examples of such compounds are film-forming hydrophilic polymers or surfactants.

The plate precursor can, if required, be post-treated with a suitable correcting agent or preservative as known in the art. To increase the resistance of the finished printing plate and hence to extend its presslife capability (run length), the layer can be briefly heated to elevated temperatures ("baking"). The plate can be dried before baking or is dried during the baking process itself. During the baking step, the plate can be heated at a temperature which is higher than the glass transition temperature of the heat-sensitive coating, e.g. between 100° C. and 230° C. for a period of 40 seconds to 5 minutes. Baking can be done in conventional hot air ovens or by irradiation with lamps emitting in the infrared or ultraviolet spectrum. As a result of this baking step, the resistance of the printing plate to plate cleaners, correction agents and UV-curable printing inks increases. Such a thermal post-treatment is described, inter alia, in DE 1,447,963 and GB 1,154,749.

The printing plate thus obtained can be used for conventional, so-called wet offset printing, in which ink and an aqueous dampening liquid is supplied to the plate. Another suitable printing method uses a so-called single-fluid ink without a dampening liquid. Suitable single-fluid inks have been described in U.S. Pat. Nos. 4,045,232; 4,981,517 and 6,140,392. In a most preferred embodiment, the single-fluid ink comprises an ink phase, also called the hydrophobic or oleophilic phase, and a polyol phase as described in WO 00/32705.

EXAMPLES

Synthesis of the Monomers for the First Polymer

The synthesis of the heterocyclic sulfonamide monomers having the structure according to formula I or II has been disclosed EP 1 826 001 and especially the synthesis of Mono-I-01, Mono-I-02, Mono-I-04, Mono-I-05, Mono-I-06, Mono-I-07, Mono-I-08, Mono-I-09, Mono-I-10, Mono-I-11 and Mono-I-12 is described in detail in this document. The synthesis of the other monomers can be carried out in a similar method as described above.

Synthesis of the Monomers Having a Structure According to Formula III.

The monomers having a structure according to formula III were prepared according to the following reaction scheme and general procedure:

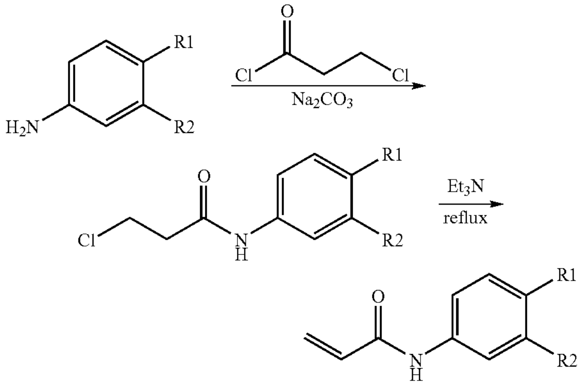

Step 1: Acylation of the Appropriate Anilines.

0.1 mol of the appropriate aniline was dissolved in 80 ml ethyl acetate. A solution of 12.72 g (0.12 mol) $Na_2CO_3$ in 100 ml water was added and the mixture was cooled to 0° C. 13.86 g (0.11 mol) 3-chloropropionyl chloride in 20 ml ethyl acetate was added over 20 minutes, while stirring. The temperature was kept at 0° C. The reaction was allowed to continue for an additional hour at room temperature. The different intermediate 3-chloropropionyl amides were isolated as described in Table 1 below.

TABLE 1

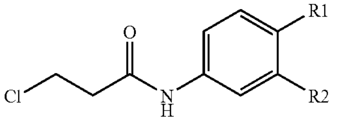

| R1 | R2 | Isolation procedure | Yield (%) | Melting point (° C.) |
|---|---|---|---|---|
| —H | —H | Filtration of the reaction mixture, followed by isolation of the organic fraction, washing the organic fraction twice with water, drying over $MgSO_4$, evaporation of the solvent under reduced pressure and crystallization from MeOH/water. | 98 | 118-120° C. |

TABLE 1-continued

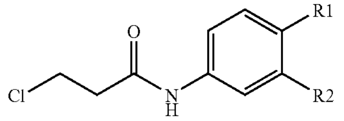

| R1 | R2 | Isolation procedure | Yield (%) | Melting point (° C.) |
|---|---|---|---|---|
| —OEt | —H | Filtration of the reaction mixture, followed by isolation of the organic fraction, washing the organic fraction twice with water, drying over $MgSO_4$, evaporation of the solvent under reduced pressure and crystallization from MeOH/water. | 83.4 | 128-130° C. |
| —COMe | —H | Filtration of the reaction mixture, followed by isolation of the organic fraction, washing the organic fraction twice with water, drying over $MgSO_4$ and evaporation of the solvent under reduced pressure. | 89.5 | 174-176° C. |
| —COOMe | —H | Filtration of the reaction mixture, followed by isolation of the organic fraction, washing the organic fraction twice with water, drying over $MgSO_4$, evaporation of the solvent under reduced pressure and treating the residue twice with water at 45° C. | 88.5 | 190° C. |
| —CN | —H | The partially precipitated compound was isolated by filtration. A second fraction was isolated by evaporation of the organic fraction. Both fractions were pooled and treated three times with 400 ml water. | 94.2 | 162° C. |
| —Cl | —H | Filtration of the reaction mixture, followed by isolation of the organic fraction, washing the organic fraction twice with water, drying over $MgSO_4$ and evaporation of the solvent under reduced pressure. | 96.3 | 126° C. |
| —$SO_2$Me | —H | The reaction mixture was evaporated under reduced pressure and the residue was treated three times with 500 ml water at 50° C., once with 250 ml 3 N HCl and twice with 200 ml water. | 96.9 | 168-170° C. |

Step 2: β-Elimination of the Appropriate Intermediate 3-Chloropropionyl Amides.

80 mmol of the appropriate 3-chloropropionyl amides was dissolved or suspended in 170 ml ethyl acetate. 160 mmol triethyl amine was added and the mixture was refluxed for 24 hours. The reaction mixture was allowed to cool down to room temperature and the different aryl acryl amides were isolated according to the description in Table 2 below.

TABLE 2

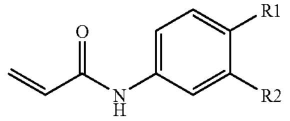

| R1 | R2 | Isolation procedure | Yield (%) | Melting point (° C.) |
|---|---|---|---|---|
| —H | —H | The salts were removed by filtration and the organic fraction was extracted twice with 80 ml 3 N HCl. The organic fraction was dried over $Na_2SO_4$ and evaporated under reduced pressure. | 89.6 | 106-108° C. |
| —OEt | —H | The ethyl acetate fraction was washed with 250 ml 5 N HCl and 100 ml 1 N $NaHCO_3$. The organic fraction was dried over $Na_2SO_4$ and evaporated under reduced pressure. The compound was purified by preparative column chromatography (Prochrom LC 80, Kromasil Si60A 10 μm, methylene chloride/ethyl acetate 88/12) | 69.7 | 118° C. |
| —COMe | —H | The reaction mixture was evaporated under reduced pressure. The residue was treated three times with 400 ml water at 50° C., once with 400 ml 3 N HCl and washed until neutral. | 98.2 | 164° C. |
| —COOMe | —H | The reaction mixture was evaporated under reduced pressure. The residue was treated three times with 400 ml water at 50° C., once with 300 ml 3 N HCl and washed until neutral. | 95.5 | 152° C. |
| —CN | —H | The reaction mixture was evaporated under reduced pressure. The residue was treated three times with 300 ml water at 50° C. | 95.0 | 208° C. |
| —Cl | —H | The reaction mixture was evaporated under reduced pressure. The residue was treated eight times with 400 ml water at 50° C. and crystallized from MeOH/water. | 81.1 | 184-185° C. |
| —$SO_2$Me | —H | The reaction mixture was evaporated under reduced pressure. The residue was dissolved in 350 ml methylene chloride and extracted twice with 200 ml 3 N HCl. The organic fraction was dried over $Na_2SO_4$ and evaporated under reduced pressure. | 30.8 | 158° C. |

Synthesis of the First Polymers.

The first polymers according to the present invention were prepared according to the following procedure.

The monomer composition, initiation temperature and molecular weight are given in table 3.

In a 250 ml reactor, the amount of each type of monomers as indicated in Table 3 were added to 35.4 g gamma-butyrolactone and the mixture was heated to 140° C., while stirring at 200 rpm. Upon complete dissolution of the monomer mixture, the reaction mixture was allowed to cool down to the initiation temperature as indicated in Table 3.80 µl of Trigonox DC50 (commercially available from AKZO NOBEL) was added at once, immediately followed by the addition of 1.121 ml of a 25% solution of Trigonox 141 (commercially available from AKZO NOBEL) in gamma-butyrolactone. After 4 minutes, 410 µl of Trigonox DC50 was added over two hours while the reaction mixture was heated to 140° C. The polymerization was allowed to continue for two hours at 140° C. The reaction mixture was allowed to cool down to 120° C. and 19.6 ml 1-methoxy-2-propanol was added. The reaction mixture was allowed to cool down to room temperature. The reaction mixture was used directly for the preparation of the coating solutions without further purification.

The presence of residual monomer in each of the samples was analyzed, using thin layer chromatography in comparison with original samples of the different monomers. Partisil KC18F plates, supplied by Whatman were used. MeOH/0.5 M NaCl 60/40 was used as eluent. In none of the samples, residual monomer could be detected.

The molecular weight of these polymers ($M_n$, $M_w$, $M_n/M_w$) was analyzed with size exclusion chromatography, using dimethyl acetamide/0.21% LiCl as eluent on a 3× mixed-B column and relative to polystyrene standards. The analytical results are given below in Table 3.

TABLE 3

The monomer composition, initiation temperature and molecular weight of Polymer-01 to Polymer-07 and Comparative Polymer-01.

| | Type and Amount (g) of Monomers | Initiation temperature | $M_n$ | $M_w$ | $M_n/M_w$ |
|---|---|---|---|---|---|
| Polymer-01 | 15.8 g of Mono-I-01 + 3.6 g of Mono-III-01 | 96° C. | 52718 | 140110 | 2.7 |
| Polymer-02 | 15.8 g of Mono-I-01 + 5.5 g of Mono-III-04 | 112° C. | 42961 | 124498 | 2.9 |
| Polymer-03 | 15.8 g of Mono-I-01 + 4.5 g of Mono-III-02 | 96° C. | 44708 | 119627 | 2.68 |
| Polymer-04 | 15.8 g of Mono-I-01 + 4.7 g of Mono-III-08 | 110° C. | 41324 | 105106 | 2.54 |
| Polymer-05 | 15.8 g of Mono-I-01 + 4.2 g of Mono-III-05 | 110° C. | 43186 | 117667 | 2.72 |
| Polymer-06 | 15.8 g of Mono-I-01 + 5.0 g of Mono-III-06 | 112° C. | 42727 | 103732 | 2.43 |
| Polymer-07 | 15.8 g of Mono-I-01 + 4.6 g of Mono-III-07 | 110° C. | 45120 | 138892 | 3.08 |
| Comparative Polymer-01 | 15.8 g of Mono-I-01 + 7.35 g of benzylacrylamide | 96° C. | 27635 | 81826 | 2.96 |

Preparation of the Lithographic Support.

A 0.30 mm thick aluminum foil was degreased by immersing the foil in an aqueous solution containing 34 g/l of sodium hydroxide at 70° C. for 6 seconds and rinsed with demineralized water for 3.6 seconds. The foil was then electrochemically grained during 8 seconds using an alternating current in an aqueous solution containing 15 g/l HCl, 15 g/l $SO_4^{2-}$ ions and 5 g/l $Al^{3+}$ at a temperature of 37° C. and a current density of 100 A/dm$^2$. The aluminum foil was then desmutted by etching with an aqueous solution containing 145 g/l of sulfuric acid at 80° C. for 5 seconds and rinsed with demineralized water for 4 seconds. The foil was subsequently subjected to anodic oxidation during 10 seconds in an aqueous solution containing 145 g/l of sulfuric acid at a temperature of 57° C. and a current density of 25 A/dm$^2$, then washed with demineralized water for 7 seconds and post-treated for 4 seconds with a solution containing 2.2 g/l of polyvinylphosphonic acid at 70° C., rinsed with demineralized water for 3.5 seconds and dried at 120° C. for 7 seconds.

The support thus obtained was characterized by a surface roughness $R^a$ of 0.35-0.40 µm (measured with interferometer NT1100) and an anodic weight of 3.0 g/m Preparation of the Underlayer of the Printing Plate Precursors PPP-01 to PPP-08.

The underlayer of PPP-01 to PPP-08 was produced by first applying a first coating layer as defined in Table 4 onto the above described lithographic support. The coating was applied at a wet coating thickness of 20 um and then dried at 115° C. for 3 minutes. The total dry coating weight of each underlayer in PPP-01 to PPP-08 amounted to 0.60 g/m$^2$.

TABLE 4

Composition of the coating solution of the underlayer of PPP-01 to PPP-08.

| INGREDIENTS (g) | PPP-01 to PPP-07 | PPP-08 |
|---|---|---|
| Dowanol (1) | 212.53 | 212.53 |
| THF (2) | 589.25 | 589.25 |
| Polymer-01 to Polymer-07 (24 wt. %) (3) | 138.18 | |
| Comparative Polymer-01 (24 wt. %) (4) | | 138.18 |
| Crystal Violet (1 wt. %) (5) | 54.40 | 54.40 |
| Tegoglide 410 (1 wt. %) (6) | 5.64 | 5.64 |

(1) Dowanol PM is 1-methoxy-2-propanol, commercially available from DOW CHEMICAL Company.
(2) THF is tetrahydrofuran.

TABLE 4-continued

Composition of the coating solution of the underlayer of PPP-01 to PPP-08.

| INGREDIENTS (g) | PPP-01 to PPP-07 | PPP-08 |
|---|---|---|

(3) A solution of 24% by weight of each of Polymer-01 to Polymer-07 in a mixture of Dowanol PM/butyrolactone (71/29).

(4) A solution of 24% by weight of Comparative Polymer-01 in a mixture of Dowanol PM/butyrolactone (71/29).

(5) A solution of 1% by weight of Crystal Violet, commercially available from CIBA-GEIGY GmbH, in Dowanol PM.

(6) A solution of 1% by weight of TEGOGLIDE 410, a copolymer of polysiloxane and poly(alkylene oxide), commercially available from TEGO CHEMIE SERVICE GmbH, in Dowanol PM.

Preparation of the Upperlayer of the Printing Plate Precursors PPP-01 to PPP-08.

The upperlayer was subsequently coated on the previous layer at a wet coating thickness of 16 μm and dried at 135° C. for 3 minutes. The composition of the coating solution of the upperlayer is given in Table 5. The dry coating weight for the second layer amounted to 0.70 g/m$^2$.

TABLE 5

Composition of the coating solution of the upperlayer of PPP-01 to PPP-08.

| INGREDIENTS (g) | PPP-01 to PPP-08 |
|---|---|
| Dowanol PM (1) | 300.86 |
| Butanone | 473.27 |
| Alnovol SPN402 (44.3 wt. %) (2) | 105.77 |
| TMCA (10 wt. %) (3) | 39.91 |
| SOO94 (4) | 1.78 |
| Crystal Violet (1 wt. %) (5) | 71.27 |
| Tegoglide 410 (1 wt. %) (6) | 7.13 |

(1) Dowanol PM is 1-methoxy-2-propanol, commercially available from DOW CHEMICAL Company.
(2) Alnovol SPN402 is a novolac solution, 44.3% by weight in Dowanol PM, commercially available from CLARIANT GmbH.
(3) TMCA is 3,4,5-trimethoxy cinnamic acid.
(4) SOO94 is an IR absorbing cyanine dye, commercially available from FEW CHEMICALS; the chemical structure of SOO94 is equal to IR-1 with X = tosylate.
(5) A solution of 1% by weight of Crystal Violet, commercially available from CIBA-GEIGY GmbH, in Dowanol PM.
(6) A solution of 1% by weight of TEGOGLIDE 410, a copolymer of polysiloxane and poly(alkylene oxide), commercially available from TEGO CHEMIE SERVICE GmbH, in Dowanol PM.

Chemical Resistance

The Chemical Resistance was measured on the printing plate precursors without the upperlayer, i.e. only having the underlayer on the lithographic support, because the chemical resistance is essentially determined by the nature of the underlayer, more specifically by the type of the polymer used in the underlayer. The differentiation in the rate of dissolution of the coating between the exposed and non-exposed area such that the exposed areas are completely removed by the developer without substantially affecting the non-exposed area, i.e. the sensitivity of the printing plate precursor, is determined by both the upperlayer and the underlayer.

For measuring the chemical resistance 3 different solutions were selected:

Test solution 1: EMERALD PREMIUM 3520, commercially available from ANCHOR;

Test solution 2: Allied Meter-X, commercially available from ABC Chemicals;

Test solution 3: Prisco 2351, a phosphate free fountain concentration, commercially available from PRISCO.

The chemical resistance was tested by contacting a droplet of 40 μl of a test solution on different spots of the coating. After 3 minutes, the droplet was removed from the coating with a cotton pad. The attack on the coating due to each test solution was rated by visual inspection as follows:

0: no attack,

1: changed gloss of the coating's surface,

2: small attack of the coating (thickness is decreased),

3: heavy attack of the coating,

4: completely dissolved coating.

The higher the rating, the less is the chemical resistance of the coating. The results for the test solutions on each coating are summarized in Table 6.

TABLE 6

Results of the chemical resistance test of the underlayer of the printing plates precursors PPP-01 to PPP-08.

| Example number | Type Precursor | Type of first polymer in underlayer | Chemical resistance Test Solution 1/2/3 |
|---|---|---|---|
| Invention Example 1 | PPP-01 | Polymer-01 | 1/1/1 |
| Invention Example 2 | PPP-02 | Polymer-02 | 1/1/1 |
| Invention Example 3 | PPP-03 | Polymer-03 | 1/1/1 |
| Invention Example 4 | PPP-04 | Polymer-04 | 1/1/1 |
| Invention Example 5 | PPP-05 | Polymer-05 | 1/1/1 |
| Invention Example 6 | PPP-06 | Polymer-06 | 1/1/1 |
| Invention Example 7 | PPP-07 | Polymer-07 | 1/1/1 |
| Comparative example 1 | PPP-08 | Comparative Polymer-01 | 1/1/1 |

The examples in Table 6 demonstrate that the underlayer of all the precursors is characterized by a high chemical resistance.

Sensitivity and Level of Undercutting.

The printing plate precursors PPP-01 to PPP-08, provided with both their underlayer and upperlayer, were exposed at varying energy densities on a Creo Trendsetter 3244 (with a 20 W imaging head and operating at 140 rpm and 2400 dpi (commercially available from Kodak).

After exposure the plates were processed with a developer as defined in Table 7 below in the developer section of an Agfa Autolith TP105 processor (commercially available from Agfa Graphics NV) and with tap water at room temperature in the finishing section. The processing conditions, namely temperature and dwell time, were adapted for each printing plate precursor so as to result in a similar sensitivity and range between 23° C./22 s and 27° C./25 s as indicated in Table 8.

TABLE 7

Composition of the developing solution.

| INGREDIENTS | Developer (g) |
|---|---|
| Na-metasilicate (1) | 100 |
| Crafol AP261 (2) | 10.82 |
| Surfynol 104H (3) | 0.67 |
| Synperonic T304 (4) | 4.32 |
| Sodium gluconate | 20 |
| Octanoic acid (5) | 15 |
| Water until | 1000 |

The conductivity was adjusted using a 50% sodium hydroxide to a value of 76 mS/cm.
(1) Na-metasilicate is sodium metasilicate pentahydrate, commercially available from SILMACO NV.
(2) Crafol AP261 is alkylether sodium salt, commercially available from COGNIS.
(3) Surfynol 104H is a surfactant, commercially available from KEYSER&MACKAY.
(4) Synperonic T304 is a block-co-polymer of polyethylene oxide (=PEO) and polypropylene oxide (=PPO) attached to ethylenediamine (=EDA) in a ratio EDA/PEO/PPO of 1/15/14 and having a mean molecular weight of 1600, commercially available from UNIQEMA.
(5) Octanoic acid (98%), commercially available from Akzo Nobel.

The right exposure, hereinafter also referred to as RE, is defined as that energy density (in mJ/cm$^2$) which fits best with a 52% dot coverage on the plate when the precursor is exposed with a 1×1 checkerboard. The dot coverage is determined by measuring the optical density with a GretagMacbeth D19C densitometer (automatic colour filter setting), commercially available from Gretag-MacBeth.

The sensitivity is defined by the RE value and the lower the RE value, the higher is the sensitivity of the precursor. The results are summarized in Table 8.

For measuring the level of undercutting, the printing plate precursors were exposed and developed as described above. The dotsize "A" of the 1×1 checkerboard pattern after development was measured with a GretagMacbeth D19C densitometer. The upperlayer of the plates was then removed by immersing the plate in a solvent wherein the underlayer is not soluble, namely in butanone for 20 s. The plate is subsequently rinsed with water and dried in an oven at 50° C. for 3 minutes. The dotsize "B" of the same 1×1 checkerboard pattern was measured again after removing the upperlayer with butanone with a GretagMacbeth D19C densitometer. The level of undercutting (UC) is defined by UC=[(A−B)/A] 0.100. The higher the UC-value, the higher the level of undercutting. According to the present invention, the level of undercutting is lower than 25%, preferably lower than 20%. The results are summarized in Table 8.

TABLE 8

Results for sensitivity and undercutting.

| Example number | Developing temp. (° C.) and dwell time (s) | RE ($mJ/cm^2$) | Level of undercutting (UC = [(A − B)/A] · 100) (%) |
|---|---|---|---|
| Invention Example 1 | 23° C./22 s | 171 | 14% |
| Invention Example 2 | 27° C./25 s | 183 | 19% |
| Invention Example 3 | 27° C./25 s | 190 | 6% |
| Invention Example 4 | 25° C./25 s | 153 | 16% |
| Invention Example 5 | 25° C./25 s | 197 | 7% |
| Invention Example 6 | 27° C./25 s | 165 | 13% |
| Invention Example 7 | 27° C./25 s | 145 | 16% |
| Comparative example 1 | 23° C./22 s | 161 | 26% |

The examples in Table 8 demonstrate that all the precursors are characterized by a RE value ranging between 145 $mJ/cm^2$ and 197 $mJ/cm^2$, indicating a high sensitivity.

The examples in Table 8 further demonstrate that the precursors of the Invention Examples 1 to 7 are characterized by a reduced level of undercutting ranging between 6% and 19%, compared with the Comparative Example 1 which shows a much higher level of undercutting of 26%.

We claim:

1. A heat-sensitive positive-working lithographic printing plate precursor comprising (1) a support having a hydrophilic surface or which is provided with a hydrophilic layer, and (2) a heat-sensitive coating comprising an underlayer on said support and thereon an upperlayer, an IR absorbing agent in at least one of said underlayer and upperlayer, a phenolic resin in said upperlayer, and a first polymer in said underlayer, wherein said first polymer is an alkaline soluble polymer comprising a first monomeric unit having a structure according to formula I or formula II and a second monomeric unit having a structure according to formula III, (formula I)

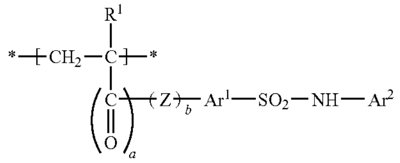

(formula II)

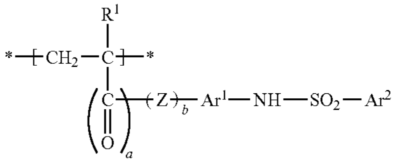

(formula III)

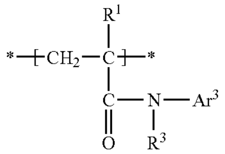

wherein

* denotes the binding sites of the monomeric unit in the polymer backbone, each $R^1$ independently represents hydrogen or an alkyl group, Z represents oxygen or $-NR^2-$, a and b independently are 0 or 1, $R^2$ represents hydrogen or an optionally substituted alkyl, alkenyl or alkynyl group, $Ar^1$ and $Ar^2$ are an aromatic group with the proviso that at least one of $Ar^1$ and $Ar^2$ is an optionally substituted heteroaromatic group, $R^3$ represents hydrogen or an optionally substituted alkyl group, an optionally substituted alkenyl group, an optionally substituted alkynyl group, an optionally substituted aralkyl group or an optionally substituted alkaryl group, or an aryl group which is not substituted by a sulphonamide group or a heteroaryl group which is not substituted by a sulphonamide group, and $Ar^3$ is an aromatic group which is not substituted by a sulphonamide group.

2. The precursor according to claim 1, wherein $Ar^3$ is an optionally substituted aryl group, with the proviso that it is not substituted by a sulphonamide group.

3. The precursor according to claim 1, wherein $Ar^3$ is an optionally substituted phenyl group, with the proviso that it is not substituted by a sulphonamide group.

4. The precursor according to claim 3, wherein said substituting group of said phenyl group does not comprise an acidic group selected from a hydroxyl group, a carboxylic acid group or a sulphonic acid group.

5. The precursor according to claim 1, wherein $R^3$ is hydrogen.

6. The precursor according to any of claims 1-5, wherein said first polymer further comprises at least one monomeric unit selected from the group consisting of an optionally N-substituted maleimide monomeric unit, an ester of a (meth) acrylic acid, polyoxyethylene (meth)acrylic acid ester, 2-hydroxy ethyl (meth)acrylate, an optionally substituted styrene, a styrene sulphonic acid, an o-vinyl benzoic acid, a p-vinyl benzoic acid, a m-vinyl benzoic acid, an optionally substituted vinyl pyridine, N-vinyl caprolactam, N-vinyl pyrrolidone, (meth)acrylic acid, itaconic acid, maleic acid, glycidyl (meth)acrylate, optionally hydrolysed vinyl acetate and vinyl phosphonic acid.

7. The precursor according to claim 1, wherein said first polymer comprises said first monomeric unit in an amount of at least 10 mol % and said second monomeric unit in an amount of at least 5 mol %.

8. The precursor according to claim 1, wherein said first polymer comprises said first monomeric unit in an amount ranging between 20 and 90 mol % and said second monomeric unit in an amount ranging between 10 and 80 mol %.

9. A method for making a lithographic printing plate comprising the steps of:

(1) providing a heat-sensitive lithographic printing plate precursor according to claim 1;

(2) image-wise exposing said precursor with IR-radiation or heat; and (3) developing said image-wise exposed precursor.

* * * * *